United States Patent
Sugiura et al.

(10) Patent No.: US 7,466,064 B2
(45) Date of Patent: Dec. 16, 2008

(54) ULTRASONIC ELEMENT

(75) Inventors: Makiko Sugiura, Hekinan (JP); Tomoki Itoh, Nagoya (JP)

(73) Assignee: DENSO CORPORATION, Kariya (JP)

( * ) Notice: Subject to any disclaimer, the term of this patent is extended or adjusted under 35 U.S.C. 154(b) by 157 days.

(21) Appl. No.: 11/355,114

(22) Filed: Feb. 16, 2006

(65) Prior Publication Data

US 2006/0186762 A1    Aug. 24, 2006

(30) Foreign Application Priority Data

Feb. 21, 2005    (JP)    ............... 2005-044805

(51) Int. Cl.
*H01L 41/08*    (2006.01)
(52) U.S. Cl. ..................................... 310/324
(58) Field of Classification Search ................ 310/321, 310/322, 324, 334
See application file for complete search history.

(56) References Cited

U.S. PATENT DOCUMENTS

| 3,745,384 A | * | 7/1973 | Blanchard ................... 310/324 |
| 4,517,486 A | * | 5/1985 | Andrews ..................... 310/331 |
| 4,641,153 A | * | 2/1987 | Cruz-Uribe .................. 347/68 |
| 5,545,461 A | | 8/1996 | Takeuchi et al. |
| 5,600,197 A | | 2/1997 | Takeuchi et al. |
| 5,774,961 A | | 7/1998 | Takeuchi et al. |
| 6,049,158 A | | 4/2000 | Takeuchi et al. |
| 6,108,880 A | | 8/2000 | Takeuchi et al. |
| 6,204,737 B1 | * | 3/2001 | Ella ........................... 333/187 |
| 6,223,601 B1 | * | 5/2001 | Harada et al. ................ 73/649 |
| 7,002,437 B2 | * | 2/2006 | Takeuchi et al. ............ 333/187 |
| 7,091,649 B2 | * | 8/2006 | Larson et al. ............... 310/324 |

FOREIGN PATENT DOCUMENTS

| JP | A-7-274288 | 10/1995 |
| JP | A-2001-16694 | 1/2001 |
| JP | A-2003-284182 | 10/2003 |

* cited by examiner

*Primary Examiner*—Mark Budd
(74) *Attorney, Agent, or Firm*—Posz Law Group, PLC

(57) ABSTRACT

An ultrasonic element has a membrane formed as a thin walled portion of a substrate, on which a piezoelectric vibrator is formed. The piezoelectric vibrator comprises a piezoelectric thin film and metal electrode films, which are formed into a sandwiched structure. The piezoelectric vibrator resonates with the membrane at a predetermined ultrasonic waveband frequency. A hollow-out pattern is formed in the piezoelectric thin film to divide the piezoelectric vibrator into multiple portions, wherein the hollow-out pattern is formed in such an area corresponding to stress concentrated area which appears in vibrations of the membrane in diametrical directions thereof. The membrane is made to be easily deformed in response to vibration of the piezoelectric vibrator, so that an ultrasound of a higher sound pressure can be emitted.

22 Claims, 10 Drawing Sheets

ULTRASONIC ELEMENT

CROSS-REFERENCE TO RELATED APPLICATION

This application is based on Japanese Patent Application No. 2005-044805 filed on Feb. 21, 2005, disclosure of which is incorporated herein by reference.

FIELD OF THE INVENTION

The present invention relates to an ultrasonic element (or an ultrasonic wave element) having a piezoelectric vibrator formed on a membrane (or a diaphragm) and being capable of resonance with the membrane at a prescribed ultrasonic wave-band frequency, and more particularly relates to an ultrasonic element usable for obstacle detection and/or other purposes in the field of automotive vehicles.

BACKGROUND OF THE INVENTION

An ultrasonic sensing equipment, which is mounted on a vehicle, such as an automobile, and used for detecting a distance between the vehicle and surrounding obstacles at the time of parking or turning thereof, is disclosed, for example, in Japanese Patent Publication No. 2001-16694. Such an ultrasonic sensing equipment is comprised of an ultrasonic element for emitting ultrasounds (ultrasonic waves) and another ultrasonic element for receiving them (or, in some cases, one ultrasonic element is commonly used as having the functions of both emitting and receiving the ultrasounds), wherein the ultrasounds are emitted by the emitting element and then the ultrasounds reflected by an obstacle are received by the receiving element. The sound pressure, time delay and phase difference of the ultrasonic waves received by the receiving element are used to detect a direction in which the obstacle exists and the distance to the obstacle, and/or to judge the degree of projections and depressions of the obstacle.

An ultrasonic sensing element, in which a vibrating device of a piezoelectric thin film is formed on a membrane which constitutes a thin film portion of a substrate, attracts attention recently as a receiving element to be used in the above ultrasonic sensing equipment for obstacle detection and/or other purposes. The ultrasonic sensing element of the membrane structure can be produced by means of semiconductor micromachining technology, which is hereinafter referred to as MEMS (Micro Electro Mechanical System) type ultrasonic sensing element. The MEMS type ultrasonic sensing element and an ultrasonic array sensor using the sensing elements, are disclosed, for example, in Japanese Patent Publication No. 2003-284182.

FIGS. 10A and 10B are simplified views of an ultrasonic element disclosed in the above Japanese Patent Publication No. 2003-284182, wherein FIG. 10A is a schematic top view of the ultrasonic sensing element 90 and FIG. 10B is a cross sectional view taken along a line XB-XB indicated by one-dot-chain line in FIG. 10A.

The ultrasonic element 90 shown in FIGS. 10A and 10B is made by using a semiconductor substrate 10 having the structure of SOI (Silicon On Insulator). In the substrate 10, reference numerals 1a, 1b, 1c and 1d respectively designate a first semiconductor layer (a supporting substrate), a buried oxide film, a second semiconductor layer and a protection oxide film. A piezoelectric vibrator 20 is formed on a membrane M, which is formed as a thin film portion of the substrate 10 by semiconductor micromachining technology, so as to wholly cover the membrane M. The piezoelectric vibrator 20 has a structure in which a piezoelectric thin film 2 is sandwiched between metal electrode films 3a and 3b. The ultrasonic element 90, as shown in FIGS. 10A and 10B, receives the ultrasounds reflected at the obstacle as a result that the piezoelectric vibrator 20 as well as the membrane M is resonated with the ultrasounds at a prescribed ultrasonic wave-band frequency.

The MEMS type ultrasonic element 90 shown in FIGS. 10A and 10B can be manufactured in tiny size and at low cost, even in case a plurality of ultrasonic elements are arrayed on the substrate 10, and furthermore the array configuration makes it possible to perform not only distance measurement but two-dimensional (2D) and three-dimensional (3D) measurement. Therefore, an ultrasonic array sensor employing such MEMS type ultrasonic element 90 as shown in FIGS. 10A and 10B has been in a development.

On the other hand, the MEMS type ultrasonic element 90 shown in FIGS. 10A and 10B is an ultrasonic element for an exclusive use of receiving, and consequently unusable at present for emitting purpose due to difficulty in outputting ultrasonic waves of sufficient sound pressure. The detection capability of 1.5 to 3 meters is generally required in the obstacle detection for automotive use, wherein the ultrasonic waves are spread in the air within the round distance of 3 to 6 meters. Since the attenuation of ultrasonic waves is higher in the air, the S/N ratio is decreased when receiving the reflected ultrasounds. Therefore, it is practically impossible to detect an obstacle, without enhancing the sound pressure of ultrasounds to be emitted. For these reasons, it is difficult to employ the same structure to the ultrasonic element 90 shown in FIGS. 10A and 10B, as an ultrasonic element for emitting the ultrasounds. In fact, as disclosed in Japanese Patent Publication No. 2003-28418, a large-sized ultrasonic emitting element (device) is separately installed to form an ultrasonic sensing equipment. According to such a separate installation of the emitting element and the receiving element, as in Japanese Patent Publication No. 2003-28418, product cost will be increased and similarly weight increase as well as design inferiority may occur due to the larger configuration.

SUMMARY OF THE INVENTION

The present invention is made in view of the above problems, and it is an object of the present invention to provide an ultrasonic element, wherein a piezoelectric vibrator is formed on a membrane and can be resonant with the membrane at a prescribed ultrasonic wave-band frequency, and further can emit ultrasounds of sufficient sound pressure to be used as an emitting element.

According to a feature of the present invention, a piezoelectric vibrator is formed on a membrane formed as a thin walled portion of a substrate, wherein the piezoelectric vibrator covers the membrane and a piezoelectric thin film is sandwiched between metal electrode films. The piezoelectric vibrator resonates with the membrane at a predetermined ultrasonic wave-band frequency, and a hollow-out pattern is partially formed in the piezoelectric thin film to divide the piezoelectric vibrator into multiple portions, wherein the hollow-out pattern is formed in such an area corresponding to stress concentrated area which appears in vibrations of the membrane in diametrical directions thereof.

According to the ultrasonic element of the present invention, stiffness of the membrane in such stress concentrated areas can be decreased, so that the membrane can be easily deformed. An ultrasound having a sufficient sound pressure can be thereby outputted, and such ultrasonic element can be used as an ultrasonic emitting element. The ultrasonic element can be used as not only the emitting element but also as an ultrasonic receiving element, which has a high conversion efficiency.

The above ultrasonic element can be made as an ultrasonic element having a higher output of the sound pressure, without enlarging a size of the element, and can be thereby manufactured at lower cost and in a small size.

According to another feature of the present invention, in the case that a plane shape of the membrane is formed into a polygon shape in the ultrasonic element, the stress concentrated area corresponds to a vicinity of a center of the polygon shape and a vicinity of each center of respective edges of the polygon shape. Accordingly, the following hollow-out patterns can be applied.

For example, the hollow-out pattern can be formed in the piezoelectric thin film as a circular shape in the vicinity of the center of the polygon shaped membrane. Alternatively, the hollow-out pattern can be formed in the piezoelectric thin film as such a polygon shape, which has the same number of edges to that of the edges of the polygon shaped membrane, in the vicinity of the center of the polygon shaped membrane.

Furthermore, the hollow-out pattern can be formed in the piezoelectric thin film as an actiniform pattern, such that the hollow-out pattern connects the vicinity of the center of the polygon shape with the vicinity of each center of the respective edges. Alternatively, the hollow-out pattern can be formed in the piezoelectric thin film as an actiniform pattern, such that the hollow-out pattern connects the vicinity of the center of the polygon shape with the vicinity of each of the respective corners.

Furthermore, the hollow-out pattern can be formed in the piezoelectric thin film as a circular shape in the vicinity of the center of the circular shaped membrane.

According to a further feature of the present invention, an ultrasound receiving element can be formed in the same substrate together with but at a different position from the ultrasound emitting element. Accordingly, the manufacturing cost of the ultrasonic sensing device can be made lower and it becomes easier to install the ultrasonic sensing device in the automotive vehicle, when compared with the case in which the emitting element and receiving elements are separately manufactured.

According to a still further feature of the present invention, a shallow groove pattern is partially formed in the piezoelectric thin film at such portions, which correspond to the stress concentrated areas in the vibrations of the membrane in the diametrical directions, so that the stiffness of the membrane at such stress concentrated areas is decreased to make the membrane easily deform.

According to a further feature of the present invention, the piezoelectric vibrator is formed into a multi-layered structure, in which multiple piezoelectric thin films and multiple metal electrode films are layered.

According to such feature, the deformation quantity of the piezoelectric vibrator is increased when the voltage is applied thereto, and thereby the amplitude of the vibration of the membrane is likewise enlarged.

According to a further feature of the present invention, the membrane and the piezoelectric vibrator are cantilevered by the substrate.

According to the above feature, the outer peripheral portions of the membrane are partly fixed to the substrate. As a result, portions of the membrane, which would be a bar against the deformation of the membrane, can be made smaller, and the membrane can be largely deformed corresponding to the deformation of the piezoelectric vibrator when the voltage is applied thereto.

According to a further feature of the present invention, the membrane is formed by stripping off a part of layers stacked on the substrate by a sacrificial layer etching, which is applied to the substrate from one side surface of the substrate.

In the ultrasonic element according to the present invention, etching holes are formed around the membrane by the process of the sacrificial layer etching. The outer peripheral portions of the membrane are thereby partially fixed to the substrate. Accordingly, portions of the membrane, which would be a bar against the deformation of the membrane, can be made smaller, and the membrane can be largely deformed when the piezoelectric vibrator is deformed by the voltage applied thereto.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

Embodiments of the present inventions will be explained below with reference to the drawings.

Figure 10A:
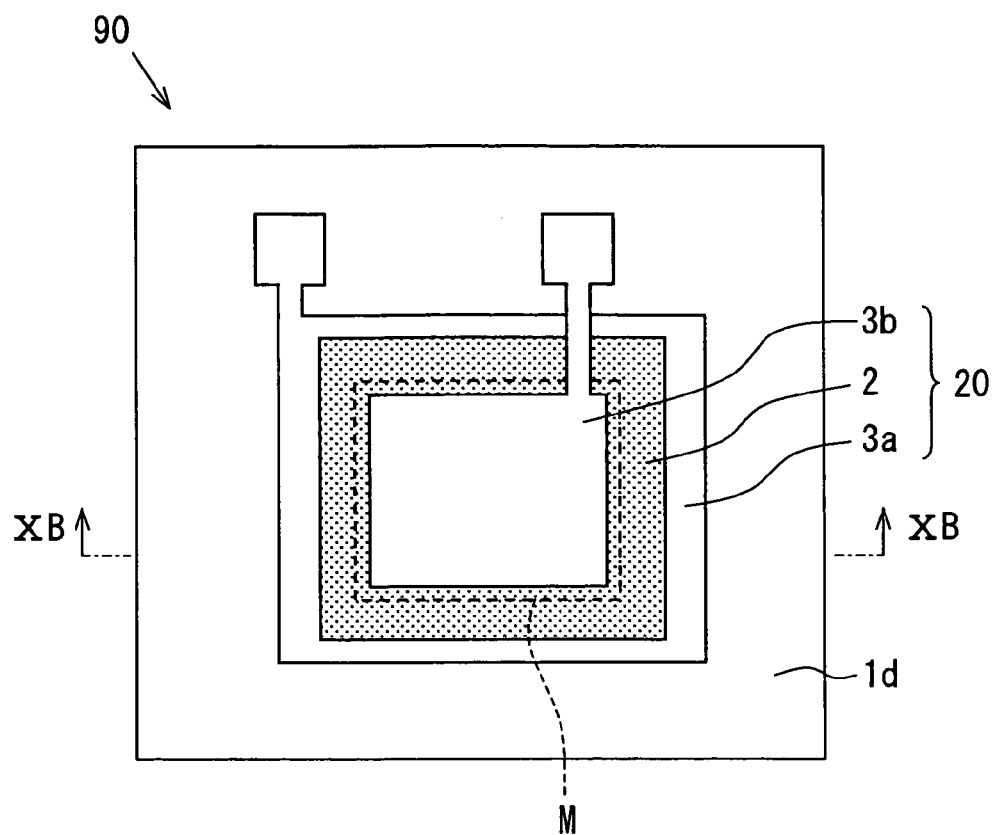
FIG. 10A is a schematic top plan view of a conventional ultrasonic element 90.
Figure 10B:
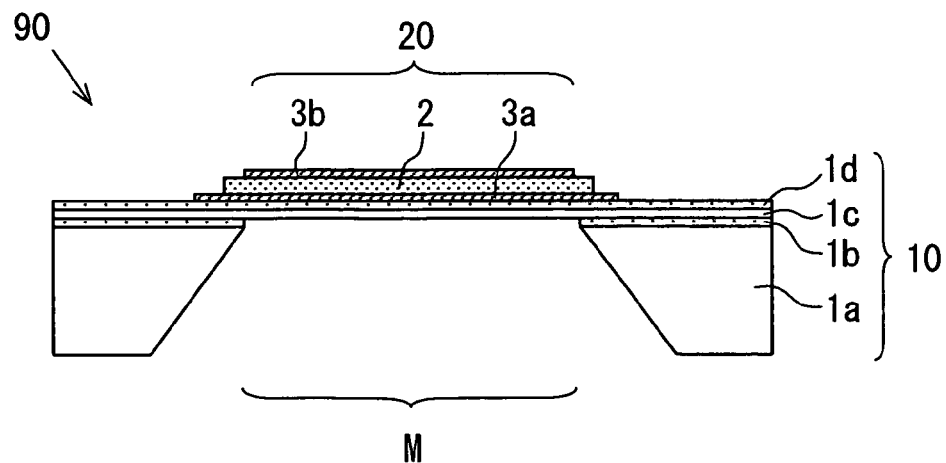
FIG. 10B is a cross sectional view taken along a one-dot-chain line XB-XB in FIG. 10A.

Firstly, reasons why the MEMS type ultrasonic element 90 of FIGS. 10A and 10B is not usable for an emitting element will be explained.

The reason is that the MEMS type ultrasonic element 90 of FIGS. 10A and 10B can not emit the ultrasounds having sufficient sound pressure. This results from the stiffness of the membrane M consisting of a second semiconductor layer 1c and a protection oxide film 1d, as well as stiffness of a piezoelectric thin film 2 and metal electrode films 3a and 3b. The membrane M is not easily deformed due to the above stiffness of the films, even when a voltage is applied to the piezoelectric vibrator 20. As a result, an amplitude of vibration for the membrane M is so small that the produced ultrasonic sound pressure is small.

It may be possible for the ultrasonic element 90 of FIGS. 10A and 10B to expand the area of the membrane M, to make the vibration amplitude larger, and/or to raise the vibration velocity (frequency) higher, so that the ultrasonic sound pressure may be increased. However, the expansion of the membrane area is inclined to result in the deflection or breakage of the membrane due to the stress applied thereto. And it is naturally accompanied with cost increase. When the vibration velocity is made higher, the ultrasonic frequency is correspondingly increased. The higher the frequency of the ultrasound is increased, the bigger the frequency attenuation in the air becomes. As a result, the ultrasounds used in the obstacle detection for the automotive are limited to a frequency range of several tens of kHz to 200 kHz. Namely, it is not possible to optionally set the vibration velocity of the membrane M at a higher level by increasing the frequency of the ultrasounds. Therefore, the only remaining means of strengthening the ultrasonic sound pressure for the ultrasonic element 90 of FIGS. 10A and 10B is to make larger the vibration amplitude of the membrane M.

Figure 1:
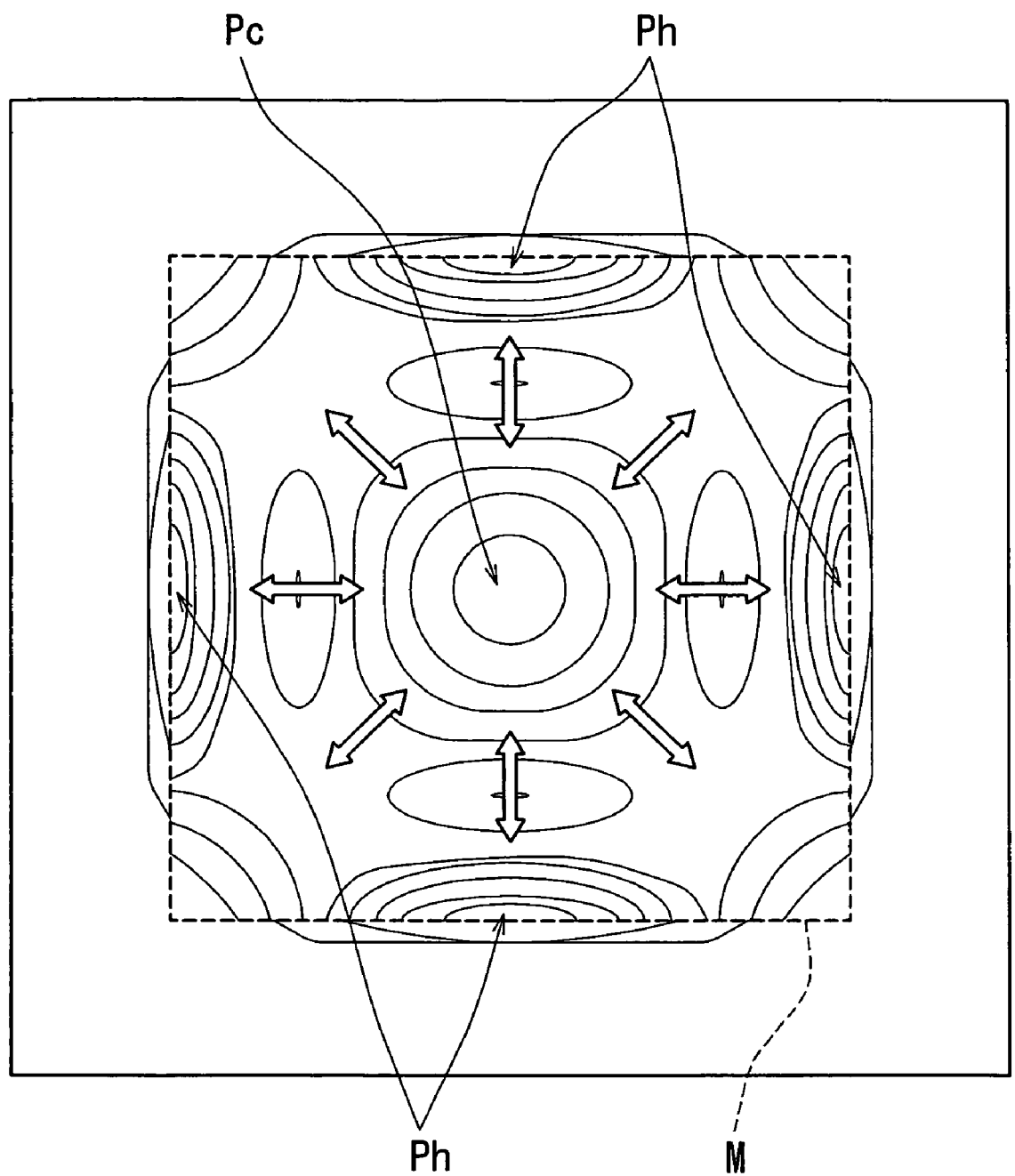
FIG. 1 is a diagram showing a simulation result of stress distribution in vibrations of a membrane in diametrical directions thereof, wherein an ultrasonic element shown in FIGS. 10A and 10B is supposed to be used as an emitting element.

FIG. 1 is a diagram showing a simulation result of stress distribution in case of vibrations of the membrane M in diametrical directions indicated by the double-headed open arrows, for the purpose of enlarging the vibration amplitude of the membrane M, wherein it is assumed that the ultrasonic element 90 of FIGS. 10A and 10B is used as the emitting element.

As shown in FIG. 1, when diametrical vibrations are given to the membrane M of the ultrasonic element 90 of FIGS. 10A and 10B, wherein the membrane M has a square shape in a plane surface, the stress concentrated area Pc appears in the vicinity of the center of the square, whereas the stress concentrated areas Ph also appear along each center of the edges of the square.

First Embodiment

Figure 2A:
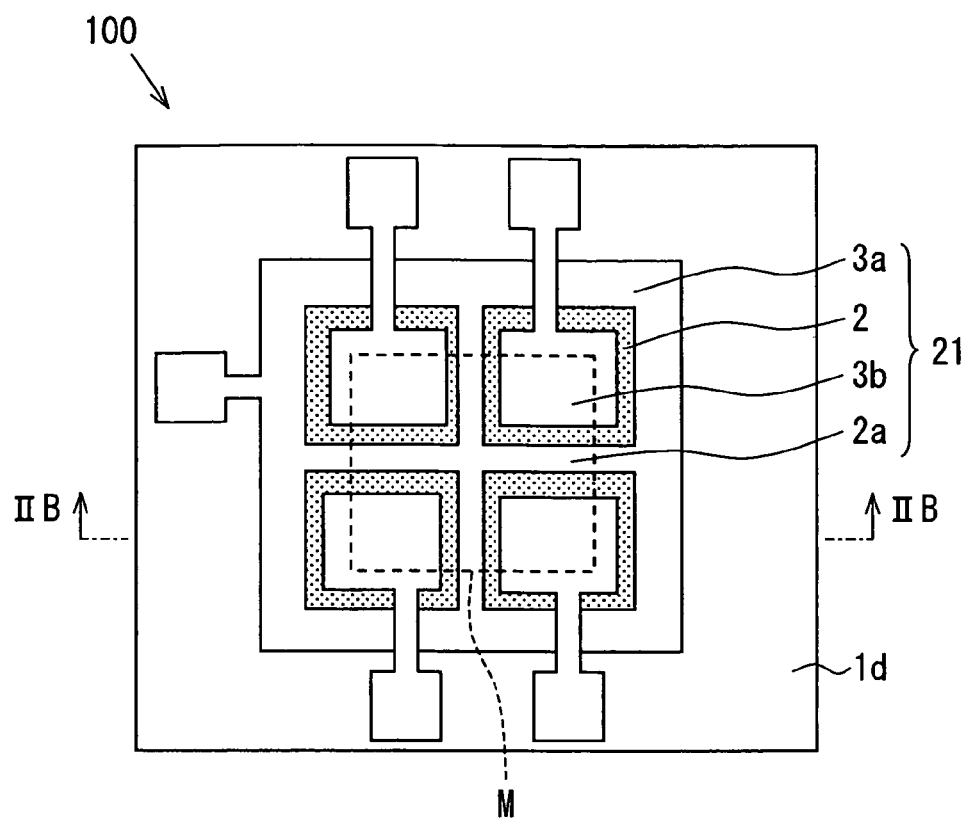
FIG. 2A is a schematic top plan view of an ultrasonic element 100 according to a first embodiment.
Figure 2B:
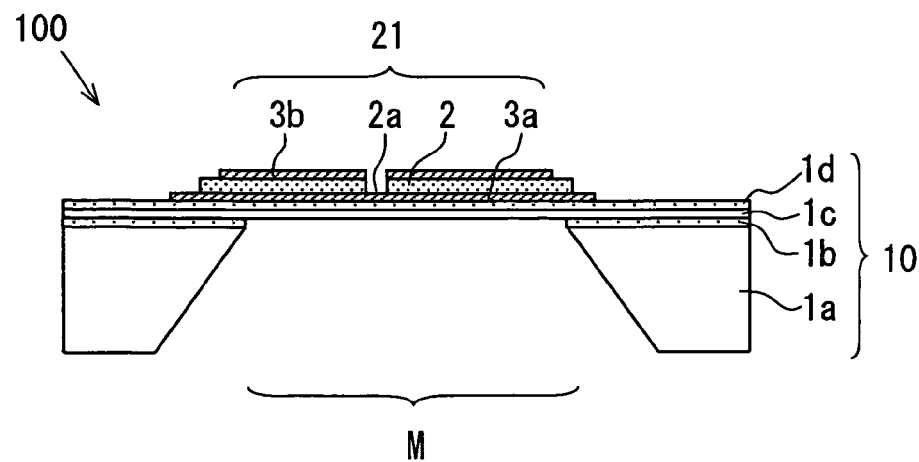
FIG. 2B is a cross sectional view taken along a one-dot-chain line IIB-IIB in FIG. 2A.

FIG. 2A is a schematic top plan view of the ultrasonic element 100 of the embodiment of the present invention, and FIG. 2B is a cross sectional view taken along a line IIB-IIB indicated by a one-dot-chain line in FIG. 2A.

The ultrasonic element 100 shown in FIGS. 2A and 2B is manufactured by using the semiconductor substrate 10 having the structure of SOI (Silicon On Insulator). Namely, a piezoelectric vibrator 21 is formed on a membrane M so as to wholly cover the membrane M, which is formed as a thin film portion (a thin walled portion) of the substrate 10, wherein the substrate 10 of the SOI structure comprises a first semiconductor layer (a supporting substrate) 1a, a buried oxide film 1b, a second semiconductor layer 1c, and a protection oxide film 1d. A plane shape of the membrane M is of a square form, and such square shaped membrane M can be easily processed and manufactured by the semiconductor micromachining technology. The ultrasonic element can be thereby obtained at low cost. The piezoelectric vibrator 21 of the ultrasonic element 100 is likewise formed into a structure, in which a piezoelectric thin film 2 is sandwiched between metal electrode films 3a and 3b. PZT (lead zirconate titanate), AlN (aluminum nitride), ZnO (zirconium oxide) and so forth can be used for the piezoelectric thin film 2. Pt (platinum), Au (gold), Al (aluminum) or the like can be used for the metal electrode films 3a and 3b.

The piezoelectric vibrator 21 of the ultrasonic element 100 differs from the piezoelectric vibrator 20 of the ultrasonic element 90 shown in FIGS. 10A and 10B, in that a partial hollow-out pattern 2a is formed in the piezoelectric thin film 2 so that the piezoelectric thin film 2 is divided into four portions. The partial hollow-out pattern 2a is formed into an actiniform pattern, in which the hollow-out portions connect the center of the square with each of the edge centers of the square of the membrane M, so that portions of the piezoelectric thin film 2 are removed away in the stress concentrated areas Pc and Ph appearing in the diametrical directions of the membrane M, as shown in FIG. 1. In the piezoelectric vibrator 21 of the ultrasonic element 100, the lower metal film electrode 3a is formed as one unit, whereas the upper metal film electrode 3b is divided into four portions, corresponding to four divided portions of the piezoelectric thin film 2, by the actiniform hollow-out pattern 2a.

The ultrasonic element 100 is so designed that the piezoelectric vibrator 21 resonates with the membrane M at a prescribed ultrasonic wave-band frequency. When an AC voltage of a predetermined frequency is applied to and between the metal electrode films 3a and 3b, the piezoelectric thin film 2 oscillates by a reverse voltage effect, so that the membrane M is deformed to push out the air in the vicinity thereof, and the ultrasounds are emitted. The membrane M is largely vibrated by the resonance of the piezoelectric vibrator 21 with the membrane M, so that the air pushing energy is enlarged to increase the emitting output of the ultrasounds.

In the ultrasonic element 90 shown in FIGS. 10A and 10B, the piezoelectric vibrator 20 of the piezoelectric thin film 2 is formed to cover the whole area of the membrane M, which is formed as the thin walled portion of the substrate 10. Accordingly, in such conventional ultrasonic element 90, the piezoelectric vibrator can not generate sufficient sound pressure because the membrane M is not easily deformed, even if a voltage is applied to the vibrator 20 in order to generate vibrations in the diametrical directions of the membrane M.

Contrarily, in the ultrasonic element 100 shown in FIGS. 2A and 2B, the partial hollow-out pattern 2a is formed in the piezoelectric thin film 2, in such portions corresponding to the stress concentrated areas Pc and Ph appearing in the vibrations in the diametrical directions of the membrane M. As a result, the stiffness of the stress concentrated areas Pc and Ph is decreased, so that the membrane M is easily deformed. The ultrasounds of sufficient sound pressure can be thereby outputted, and the ultrasonic element 100 can be used as the emitting element. The use of the ultrasonic element should not be limited to the emitting element, and the ultrasonic element 100 can be also usable as the ultrasonic receiving element having a high conversion efficiency.

The ultrasonic element 100 is the emitting element having high output performance without enlarging the size of the membrane M, while keeping its miniaturization and cost reduction feasible.

Figure 3A:
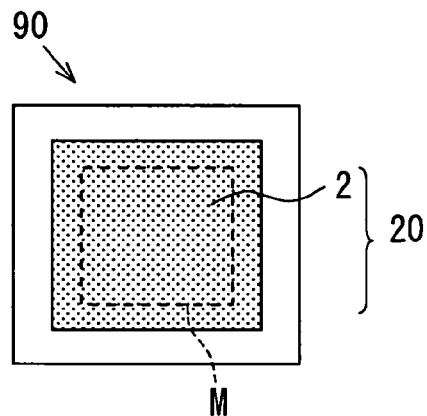
FIGS. 3A to 3D are schematic top plan views of respective ultrasonic elements 90, 100, 101, and 102.
Figure 3B:
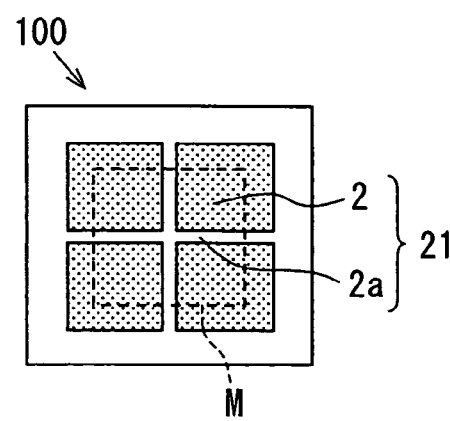
Figure 3C:
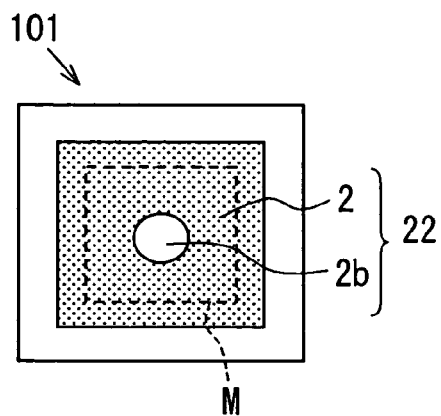
Figure 3D:
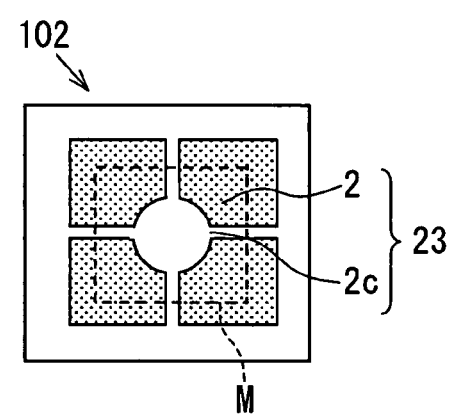
Figure 3E:
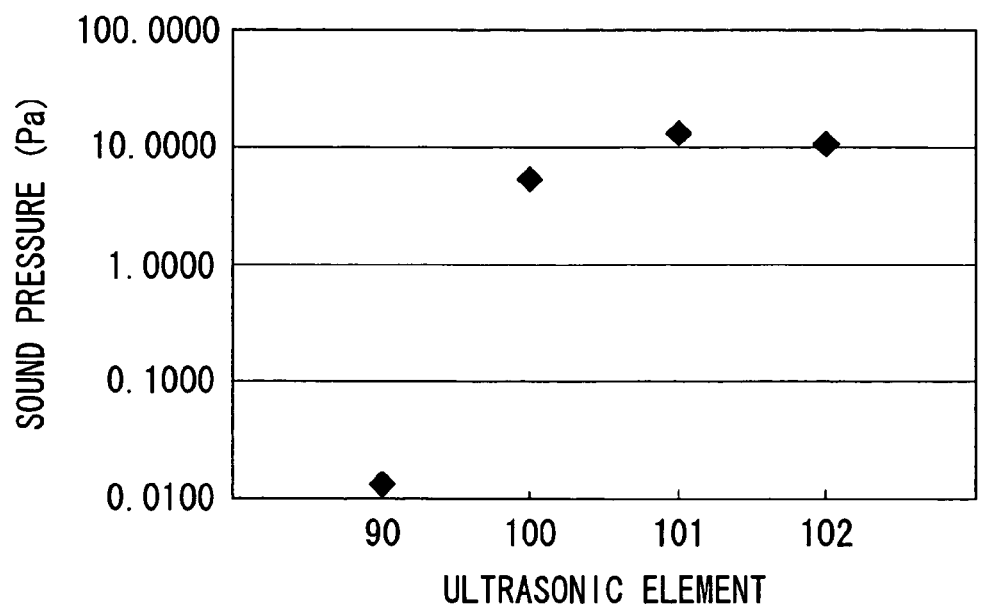
FIG. 3E is a diagram showing sound pressures investigated for each of the ultrasonic elements 90, 100, 101, and 102.

FIG. 3E shows sound pressures investigated for each of the ultrasonic elements 90, 100, 101, and 102 respectively shown in FIGS. 3A to 3D, wherein each of them was used as the emitting element. In FIGS. 3A to 3D, which are schematic top plan views of the ultrasonic elements 90, 100, 101, and 102, the metal electrode films at upper and lower layers of the piezoelectric thin film 2 are omitted for simplified illustration. FIG. 3E explains the analyzed sound pressures measured at ten centimeters away from the respective four ultrasonic elements 90,100,101 and 102.

The ultrasonic element 90 in FIG. 3A is identical with the conventional ultrasonic element 90 shown in FIGS. 10A and 10B. The ultrasonic element 100 in FIG. 3B is identical with the ultrasonic element 100 shown in FIGS. 2A and 2B of the present invention.

The ultrasonic element 101 in FIG. 3C is a variation of the ultrasonic element 100 shown in FIG. 3B, having a piezoelectric vibrator 22 provided with a circular shaped hollow-out pattern 2b in the piezoelectric thin film 2 in the vicinity of the square center of the membrane M. A portion of the piezoelectric thin film 2 is removed by the circular shaped hollow-out pattern 2b, wherein the removed portion corresponds to the stress concentrated area Pc in case of the vibrations of the membrane M in the diametrical directions, as shown in FIG. 1.

The ultrasonic element 102 in FIG. 3D is a variation having a piezoelectric vibrator 23 provided with a hollow-out pattern 2c, which is a combination of the actiniform hollow-out pattern 2a and the circular shaped hollow-out pattern 2b. Portions of the piezoelectric thin film 2 are removed by the hollow-out pattern 2c, wherein the removed portions correspond to the stress concentrated areas Pc and Ph in case of the vibrations of the membrane M in the diametrical directions, as shown in FIG. 1.

As shown in FIG. 3E, the ultrasonic elements 100 to 102 of the present invention, in which the partial hollow-out patterns 2a to 2c are formed in the piezoelectric thin film 2, can emit the ultrasounds of approximately triple-digit time larger sound pressure than those of the conventional ultrasonic element 90, for which the hollow-out pattern was not formed.

According to the result shown in FIG. 3E, the ultrasonic element 101 of FIG. 3C, for which the circular shaped hollow-out pattern 2b is formed in the piezoelectric thin film 2 in the vicinity of the square center of the membrane M, shows the highest sound pressure. It is, therefore, preferable not to remove away the portions of the piezoelectric thin film 2 around the edge centers of the membrane M for obtaining the ultrasonic element of high sound pressure. This is presumably because the stress produced in the piezoelectric thin film 2 is easily converted into the deflection of the membrane M around each center of the square edges of the membrane M.

FIGS. 4A to 4F are schematic top plan views of other ultrasonic elements 103 to 108 according to the embodiment of the present invention. The metal electrode films at upper and lower layers of the piezoelectric thin film 2 are omitted from FIGS. 4A to 4F for simplified illustration.

Figure 4A:
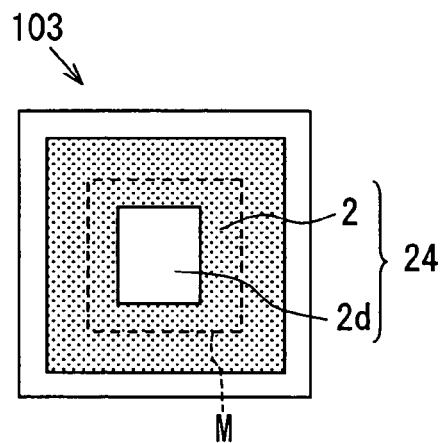
FIGS. 4A to 4F are schematic top plan views, respectively showing variations of the ultrasonic element according to the first embodiment.

An ultrasonic element 103 in FIG. 4A has a piezoelectric vibrator 24 provided with a square shaped hollow-out pattern 2d in the piezoelectric thin film 2 in the vicinity of the square center of the membrane M, wherein the square shaped hollow-out pattern 2d has the same edge number to that of the membrane M. An ultrasonic element 104 in FIG. 4B has a piezoelectric vibrator 25 provided with a hexagon shaped hollow-out pattern 2e in the piezoelectric thin film 2 in the vicinity of a center of a hexagon shaped membrane Ma, wherein the hexagon shaped hollow-out pattern 2e has the same edge number to that of the hexagon shaped membrane Ma. An ultrasonic element 105 in FIG. 4C has a piezoelectric vibrator 26 provided with an octagon shaped hollow-out pattern 2f in the piezoelectric thin film 2 in the vicinity of a center of an octagon shaped membrane Mb, wherein the octagon shaped hollow-out pattern 2f has the same edge number to that of the octagon shaped membrane Mb. In the ultrasonic elements 103 to 105, portions of the piezoelectric thin film 2 are removed by the polygon shaped hollow-out patterns 2d to 2f, wherein the removed portions correspond to the stress concentrated area in the vicinity of the polygon center.

Figure 4B:
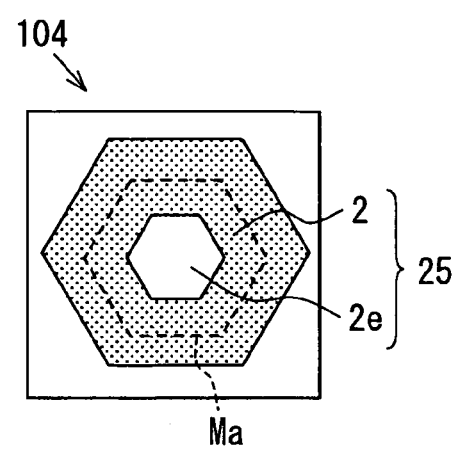
Figure 4C:
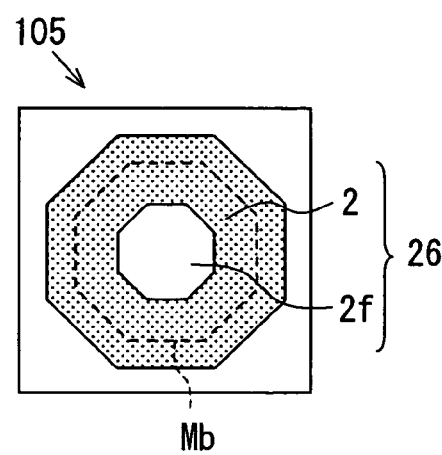
Figure 4D:
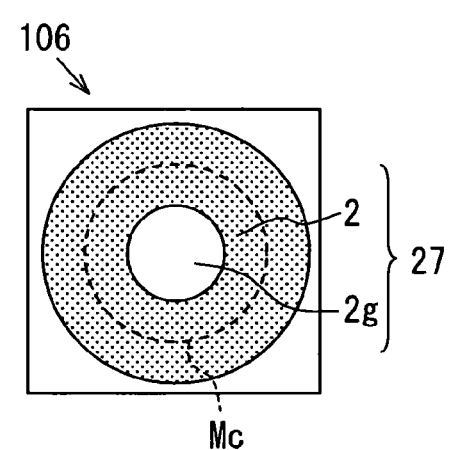

Similarly, an ultrasonic element 106 in FIG. 4D has a piezoelectric vibrator 27 provided with a circular shaped hollow-out pattern 2g in the piezoelectric thin film 2 in the vicinity of a center of a circular shaped membrane Mc. In the ultrasonic element 106, a portion of the piezoelectric thin film 2 is also removed by the circular shaped hollow-out pattern 2g, wherein the removed portion corresponds to the stress concentrated area in the vicinity of a center of the circle.

Furthermore, as described above, the membrane M of the ultrasonic element 103 in FIG. 4A has the square shape, and this kind of square shaped membrane can be easily processed with the semiconductor micromachining technology, to obtain the ultrasonic element of low cost. On the other hand, the plane shapes of the membranes Ma to Mc of the ultrasonic elements 104 to 106 in FIGS. 4B to 4D are hexagonal, octagonal or circular, and any of the membranes Ma to Mc has such a structure, according to which the stress produced around outer peripheral portions can be likely to be dispersed. Accordingly, the stress can be equally dispersed and the deformation of the membranes Ma to Mc becomes symmetric with respect to the center thereof, forming the hollow-out patterns 2e to 2g in the vicinity of the center of the membranes Ma to Mc, wherein the shape of the hollow-out patterns 2e to 2g is respectively formed into the similar shapes. As a result, the ultrasonic elements 104 to 106 can be made as ones having superior directivity of the ultrasounds.

Figure 4E:
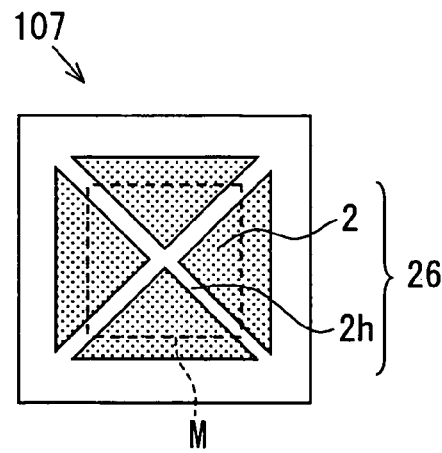

According to an ultrasonic element 107 shown in FIG. 4E, a membrane M is formed into a square shape and an actiniform hollow-out pattern 2h is formed in the piezoelectric thin film 2, wherein hollow-out (removed) portions connect a vicinity of a square center with respective corners of the square shaped membrane M. According to the hollow-out pattern 2h in the ultrasonic element 107 of FIG. 4E, the portions of the piezoelectric thin film 2 are removed in the vicinity of the stress concentrated area Pc (the square center).

Figure 4F:
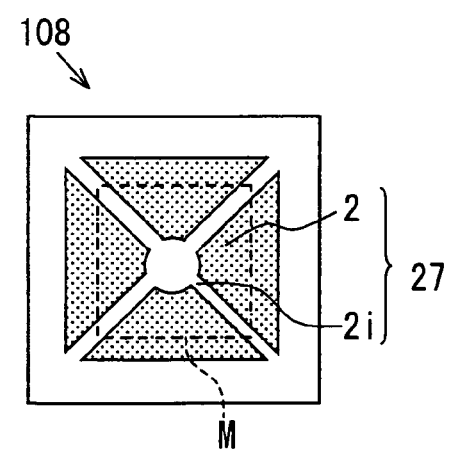

The ultrasonic element 108 shown in FIG. 4F is a variation having a piezoelectric vibrator 27 provided with a hollow-out pattern 2i, which is a combination of the actiniform hollow-out pattern 2h and the circular shaped hollow-out pattern 2b. The hollow-out pattern 2i formed in the piezoelectric thin film 2 is likewise processed by removing portions of the piezoelectric thin film 2 in the stress concentrated area Pc.

In any of the foregoing ultrasonic elements 103 to 108 shown in FIGS. 4A to 4F, the stiffness of the stress concentrated areas of the membranes M and Ma to Mc in the vibrations in the diametrical directions can be decreased so that the membranes M and Ma to Mc can be easily deformed. As a result, the ultrasounds of the sufficient sound pressure can be produced, and thereby the ultrasonic elements 103 to 108 can be used as the emitting element.

As described above, although the ultrasonic elements 103 to 108 are usable as the ultrasonic receiving element, the ultrasonic elements 103 to 108 are more preferably used as the ultrasonic emitting element that requires the higher output.

Figure 5:
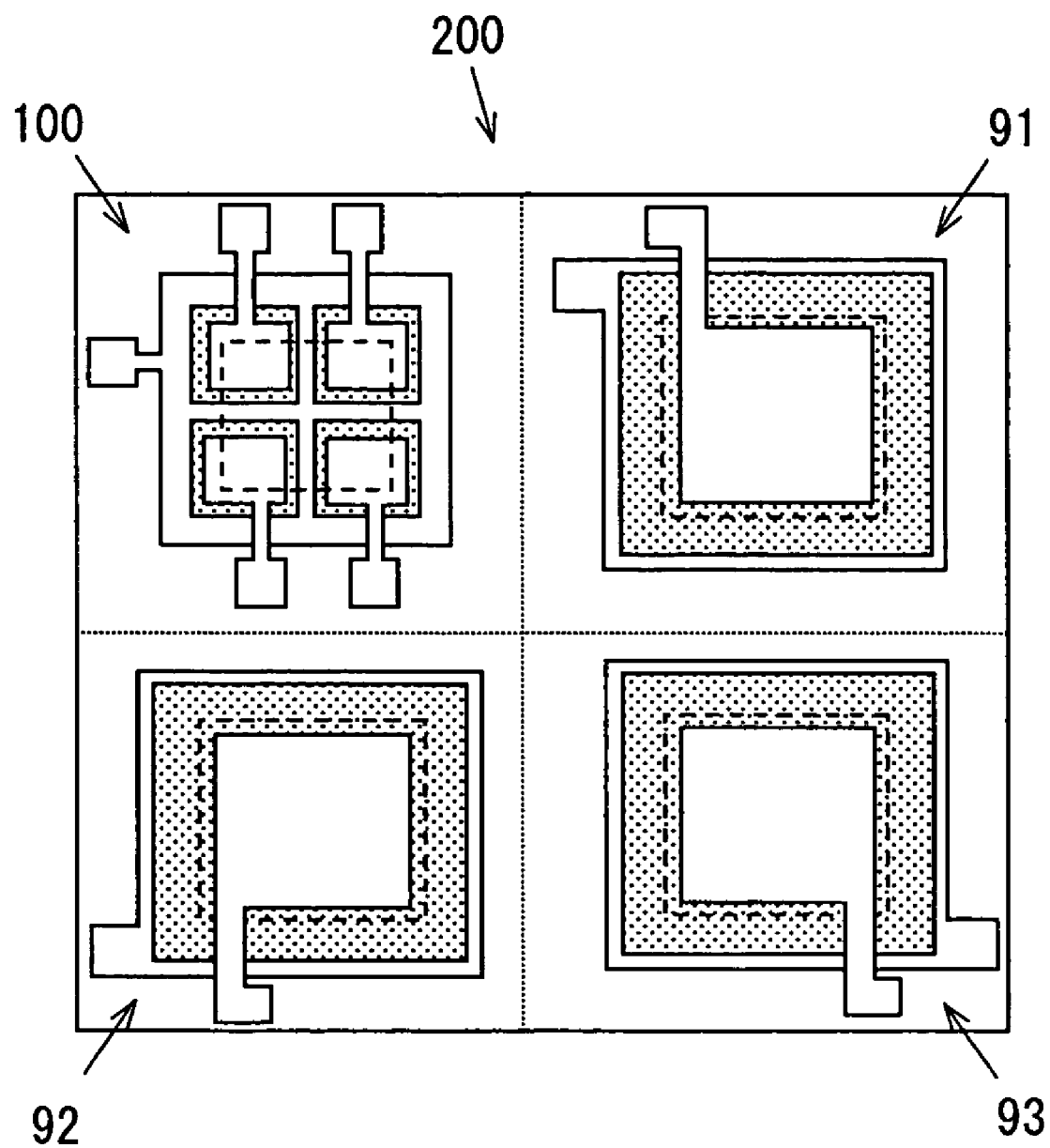
FIG. 5 is a schematic top plan view showing an example of an ultrasonic sensing device 200, to which the ultrasonic element 100 is applied.

FIG. 5 is a schematic top plan view of an ultrasonic sensing device 200, as an example to which the ultrasonic element 100 of FIGS. 2A and 2B is applied.

In the ultrasonic sensing device 200 in FIG. 5, the ultrasonic element 100 is used as the emitting element, whereas the conventional ultrasonic element 90 shown in FIGS. 10A and 10B is used as the receiving element. In the ultrasonic sensing device 200, one emitting element 100 and three receiving elements 91 to 93 are respectively formed in different positions of the same substrate 10. Since the emitting element 100 and the receiving elements 91 to 93 are formed on the same substrate 10, those elements can be simultaneously manufactured at the same processes. Accordingly, the manufacturing cost for the ultrasonic sensing device 200 can be lowered, when compared with the case in which the emitting element and receiving elements are separately manufactured. Furthermore, it becomes easier to install the ultrasonic sensing device 200 in the automotive vehicle because of the unitary configuration of those elements 100 and 91 to 93 on the same substrate 100. Although the conventional ultrasonic elements 91 to 93 are used as the receiving elements in the ultrasonic sensing device 200 of FIG. 5, the ultrasonic element (having the same structure to the emitting element 100 of the present invention) can be used as the receiving elements.

As above, the piezoelectric vibrators 20 to 27 are formed on the membranes M, Ma to Mc of the ultrasonic elements 100 to 108, wherein the piezoelectric vibrators 20 to 27 are resonated with the membranes M, Ma to Mc at the predetermined ultrasonic wave-band frequency. As a consequence, the ultrasonic elements 100 to 108 can output the ultrasonic waves of sufficient sound pressure and thus can be used as the emitting elements.

Second Embodiment

According to the second embodiment, shallow groove patterns are partially formed in the piezoelectric thin film in the vicinity of the stress concentrated areas, in order that the stiffness of the membranes in the vicinity of the stress concentrated areas is decreased to thereby make the membranes easily deform.

Figure 6A:
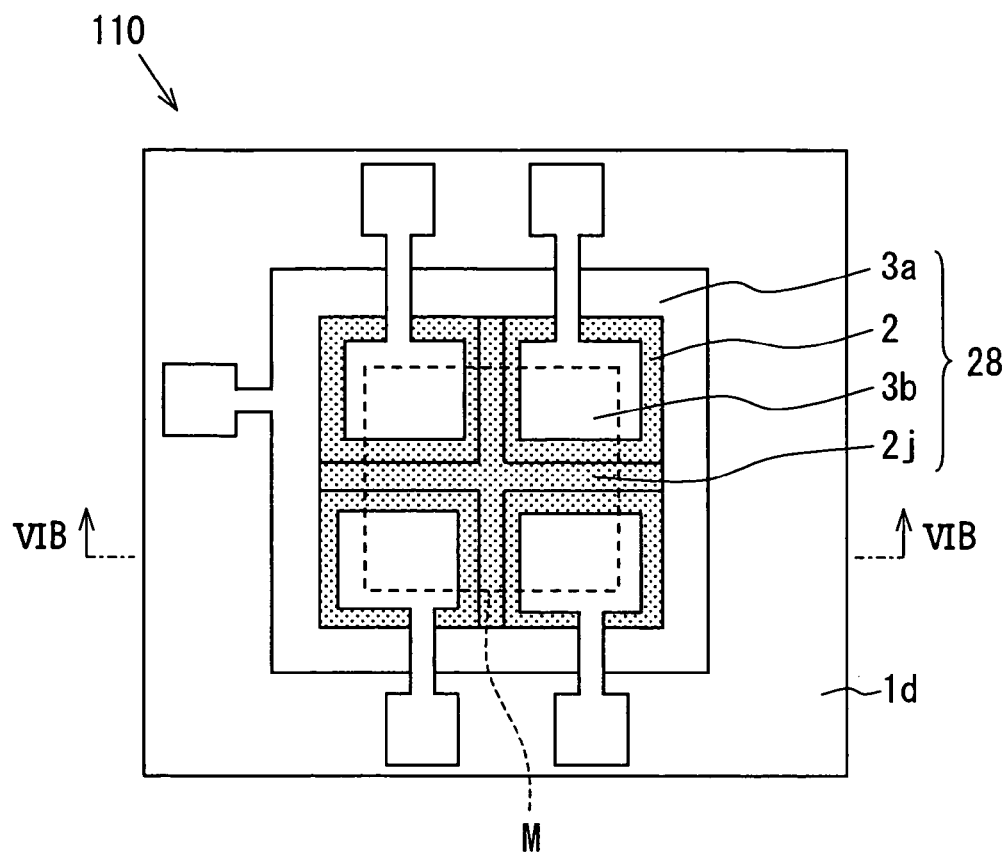
FIG. 6A is a schematic top plan view of an ultrasonic element 110 according to a second embodiment.
Figure 6B:
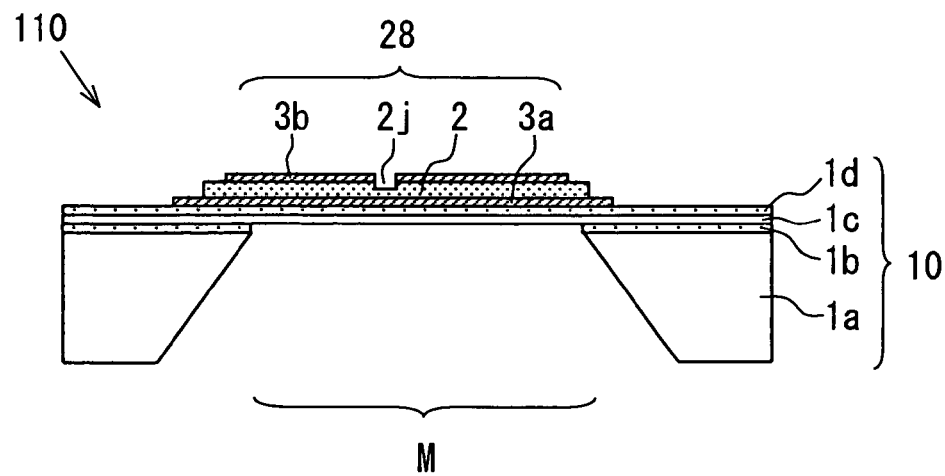
FIG. 6B is a cross sectional view taken along a one-dot-chain line VIB-VIB in FIG. 6A.

FIG. 6A is a schematic top plan view of an ultrasonic element 110 of this embodiment, whereas FIG. 6B is a cross sectional view taken along a line VIB-VIB indicated by a one-dot-chain line in FIG. 6A. In the ultrasonic element 110 in FIGS. 6A and 6B, the same reference numerals are used to designate the same portions as the ultrasonic element 100 of FIGS. 2A and 2B.

The ultrasonic element 110 shown in FIGS. 6A and 6B, is likewise manufactured by the semiconductor substrate 10 having the SOI structure, as in the same manner to the ultrasonic element 100 shown in FIGS. 2A and 2B.

In the piezoelectric vibrator 21 of the ultrasonic element 100 shown in FIGS. 2A and 2B, the hollow-out patterns are partially formed to divide the piezoelectric thin film into four portions, whereas the shallow groove patterns are partially formed in the piezoelectric thin film 2 for the piezoelectric vibrator 28 of the ultrasonic element 110 shown in FIGS. 6A and 6B. Therefore, the piezoelectric thin film 2 is not completely divided into multiple portions, but to define the multiple portions. The shallow groove patterns 2j of the ultrasonic element 110 is likewise formed as such actiniform pattern, which connects the vicinity of the square center with each of the edge centers of the square shaped membrane M, by partly removing the piezoelectric thin film 2 in the vicinity of the stress concentrated areas.

The ultrasonic element 110 in FIGS. 6A and 6B is also formed as such ultrasonic element that the piezoelectric vibrator 28 is resonated with the membrane M at the predetermined ultrasonic wave-band frequency.

Since the advantages of the ultrasonic element 110 having the shallow groove pattern 2j shown in FIGS. 6A and 6B are similar to those of the ultrasonic element 100 having the hollow-out pattern 2a shown in FIGS. 2A and 2B, the explanation thereof is omitted here. The shape of the shallow groove pattern 2j is not limited to the actiniform pattern shown in FIG. 6A, and various kinds of shallow groove patterns may be possible, as in the same manner to the hollow-out patterns 2b to 2i shown in FIG. 3 and FIG. 4.

Third Embodiment

The third embodiment relates to an ultrasonic element having a multi-layered piezoelectric vibrator.

Figure 7A:
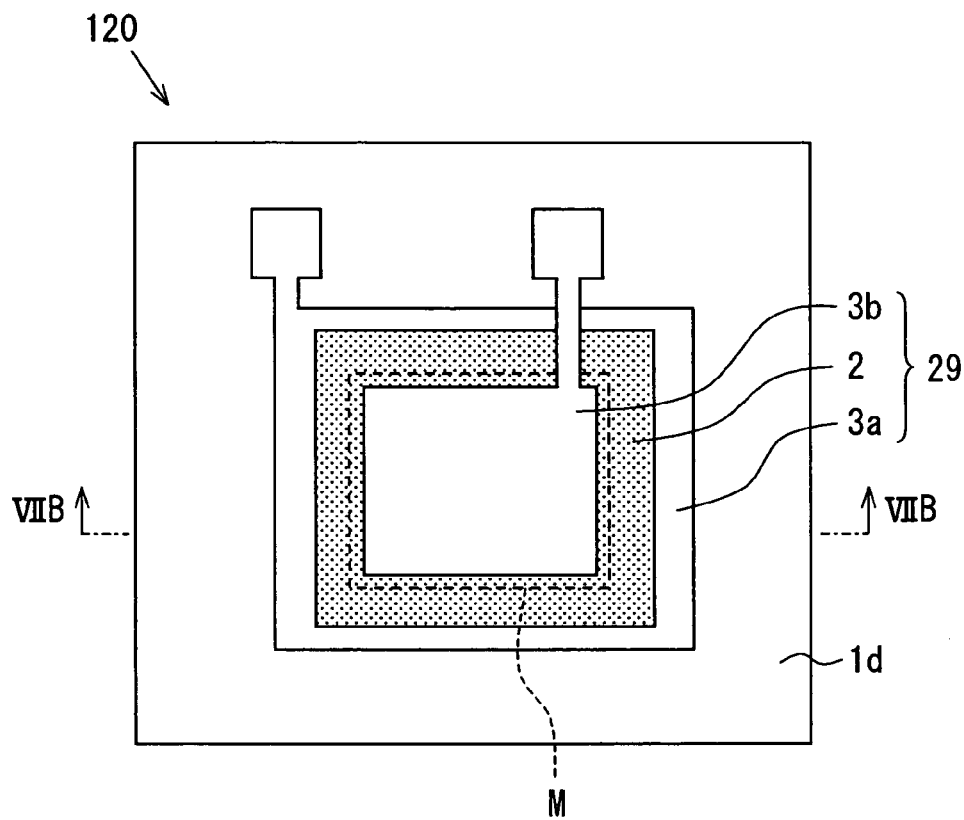
FIG. 7A is a schematic top plan view of an ultrasonic element 120 according to a third embodiment.
Figure 7B:
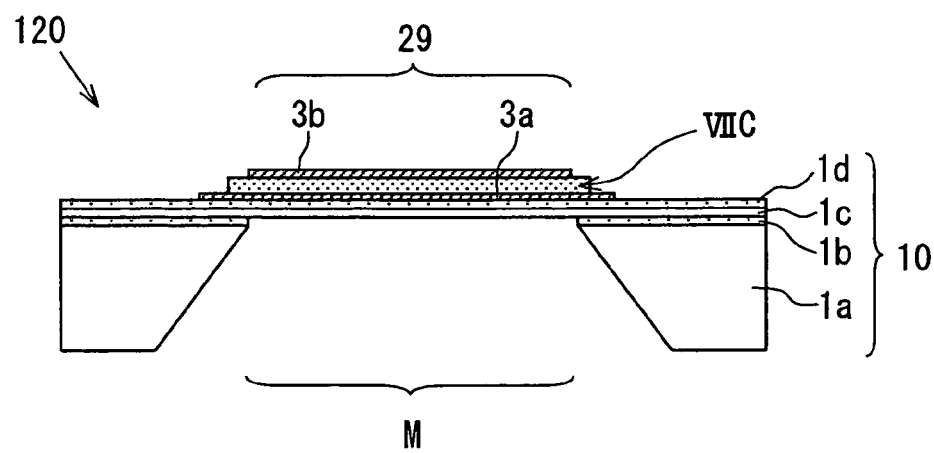
FIG. 7B is a cross sectional view taken along a one-dot-chain line VIIB-VIIB in FIG. 7A.
Figure 7C:
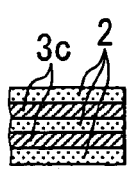
FIG. 7C is an enlarged cross sectional view for a portion of a multi-layered piezoelectric vibrator shown in FIG. 7B.

FIG. 7A is a schematic top plan view of the ultrasonic element 120 of this embodiment, FIG. 7B is a cross sectional view taken along a line VIIB-VIIB indicated by a one-dot-chain line in FIG. 7A, and FIG. 7C is an enlarged view of a portion of the multi-layered piezoelectric vibrator. In the ultrasonic element 120 in FIGS. 7A to 7C, the same reference numerals are used to designate the same portions as the ultrasonic element 90 of FIGS. 10A and 10B.

The ultrasonic sensing element 120 shown in FIGS. 7A to 7C, is likewise manufactured by the semiconductor substrate 10 having the SOI structure, as in the same manner to the ultrasonic element 90 shown in FIGS. 10A and 10B.

The piezoelectric vibrator 20 of the ultrasonic element 90 of FIGS. 10A and 10B has one layer of the piezoelectric thin film 2, whereas the piezoelectric vibrator 29 of the ultrasonic element 120 shown in FIGS. 7A to 7C is formed as the multi-layered vibrator, in which the multiple piezoelectric thin films 2 and the multiple electrode metal films 3c are alternately layered, as in shown in FIG. 7C.

Accordingly, when the voltage is applied thereto, the deformation quantity is significantly increased so that the amplitude of the vibration of the membrane M is correspondingly increased.

Fourth Embodiment

An ultrasonic element according to this fourth embodiment relates to an ultrasonic element having a configuration, in which a membrane with a piezoelectric vibrator thereon is cantilevered by a substrate, that is, the membrane is supported at its one side portion.

Figure 8A:
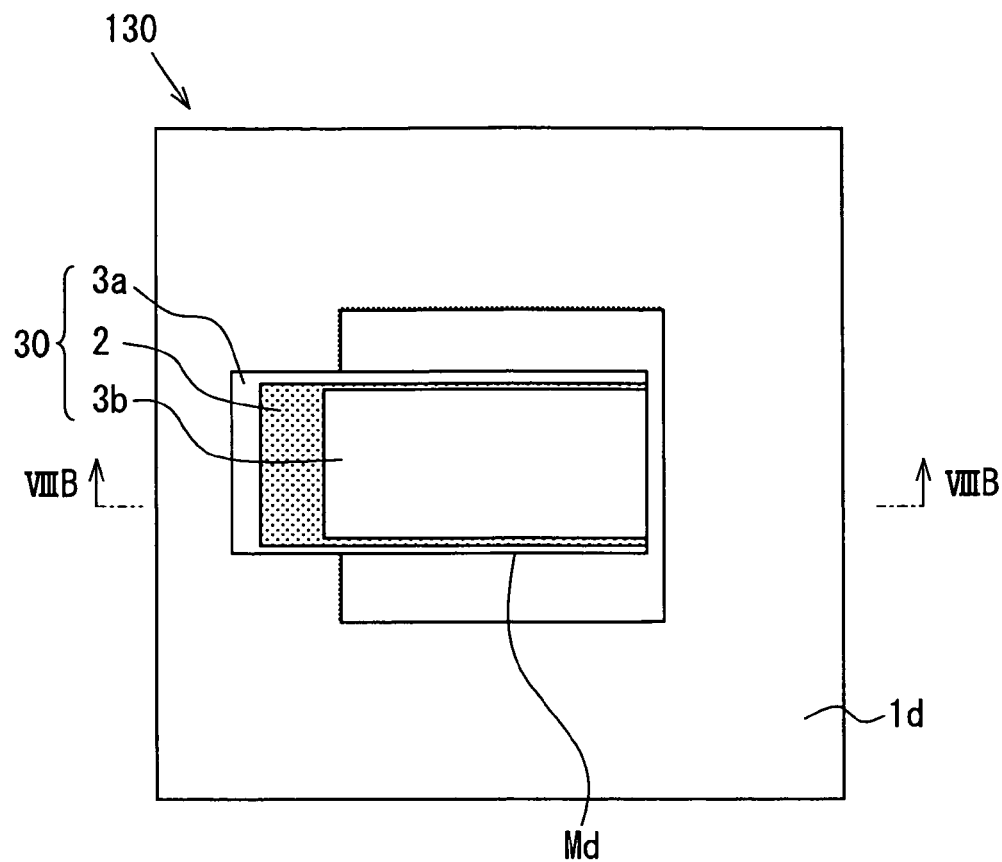
FIG. 8A is a schematic top plan view of an ultrasonic element 130 according to a fourth embodiment.
Figure 8B:
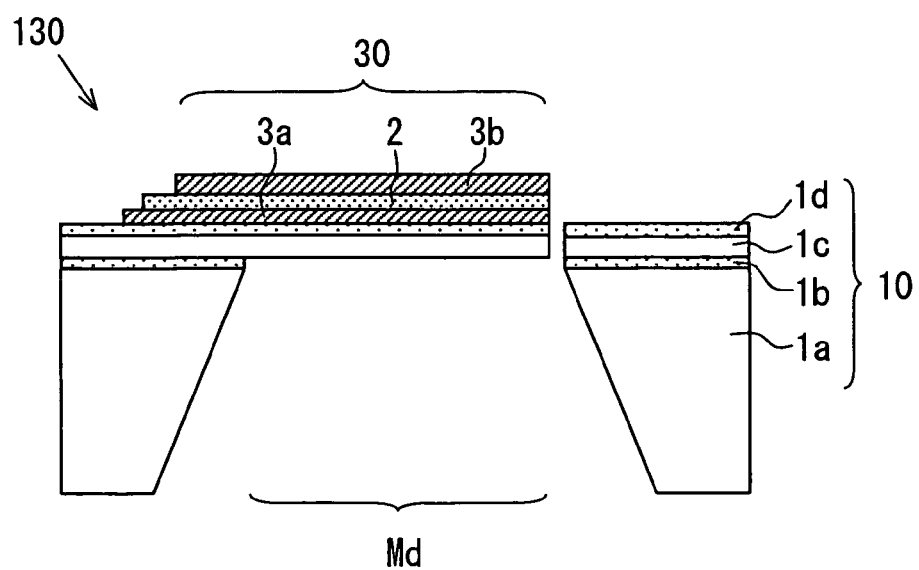
FIG. 8B is a cross sectional view taken along a one-dot-chain line VIIIB-VIIIB in FIG. 8A.

FIG. 8A is a schematic top plan view of the ultrasonic element 130 of this embodiment, whereas FIG. 8B is a cross sectional view taken along a line VIIIB-VIIIB indicated by a one-dot-chain line in FIG. 8A. In the ultrasonic element 130 in FIGS. 8A and 8B, the same reference numerals are used to designate the same portions as the ultrasonic element 90 of FIGS. 10A and 10B.

The ultrasonic element 130 shown in FIGS. 8A and 8B, is likewise manufactured by the semiconductor substrate 10 having the SOI structure, as in the same manner to the ultrasonic element 90 shown in FIGS. 10A and 10B.

In the ultrasonic element 90 shown in FIGS. 10A and 10B, all outer peripheral portions of the membrane M are fixed to the substrate 10, whereas the membrane Md and the piezoelectric vibrator 30 are cantilevered by the substrate 10 in the ultrasonic element 130, as shown in FIGS. 8A and 8B.

In the conventional ultrasonic element 90 shown in FIGS. 10A and 10B, the membrane M is not easily deformed and the ultrasound having the sufficient sound pressure may not be thereby obtained, even if the voltage is applied to the ultrasonic vibrator 20 so as to vibrate the same in the diametrical directions of the membrane M. This is because all of the outer peripheral portions of the membrane M (which is formed as the thin walled portion) are fixed to the substrate 10.

According to the ultrasonic element 130 of the present invention shown in FIGS. 8A and 8B, however, the membrane Md and the piezoelectric vibrator 30 are cantilevered by the substrate 10, in other words, the outer peripheral portions of the membrane Md is partially fixed upon and supported by the substrate 10. As a result, portions of the membrane Md, which would be a bar against the deformation of the membrane Md, can be made smaller, and the membrane Md can be largely deformed corresponding to the deformation of the piezoelectric vibrator 30 when the voltage is applied thereto.

Fifth Embodiment

An ultrasonic element according to the fifth embodiment relates to an ultrasonic element having a configuration, in which a membrane is formed by stripping off a part of layers stacked on the substrate with sacrificial layer etching from one side surface of the substrate.

Figure 9A:
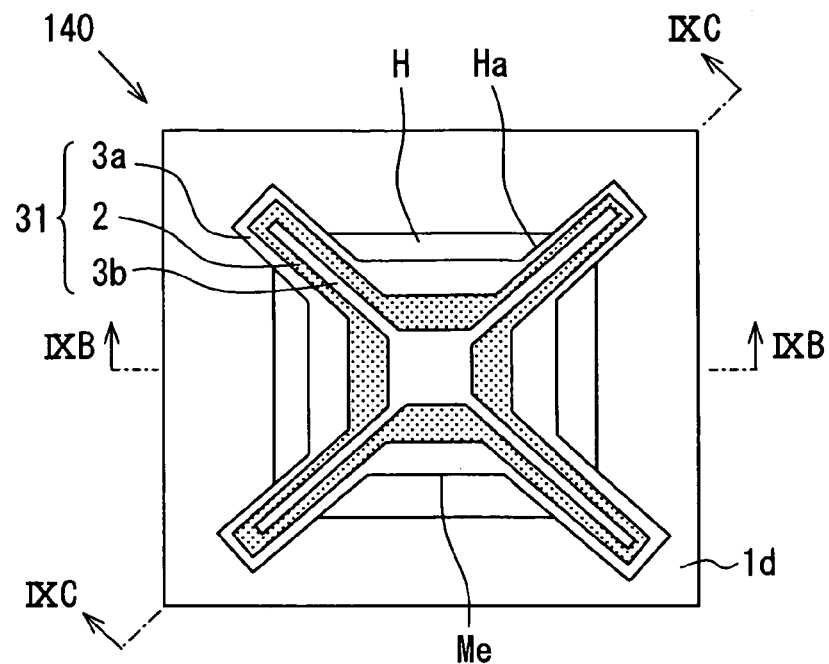
FIG. 9A is a schematic top plan view of an ultrasonic element 140 according to a fifth embodiment.
Figure 9B:
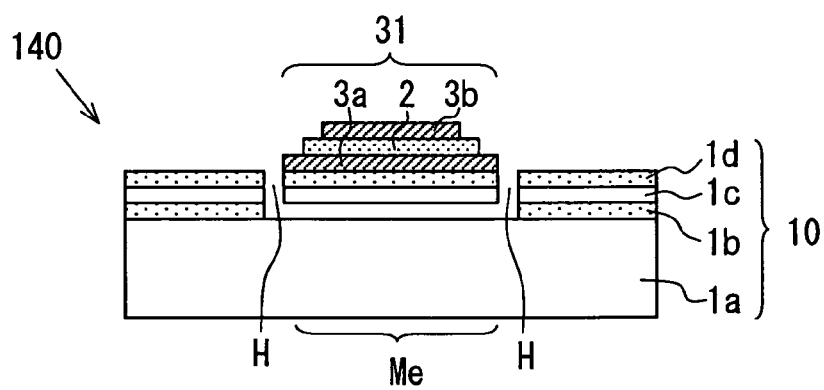
FIG. 9B is a cross sectional view taken along a one-dot-chain line IXB-IXB in FIG. 9A.
Figure 9C:
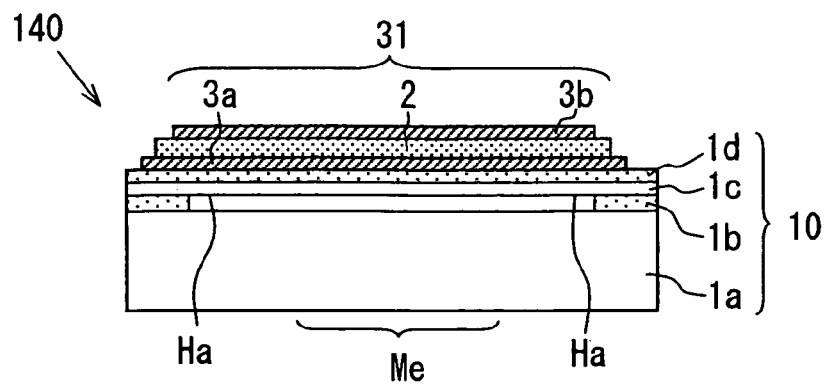
FIG. 9C is a cross sectional view taken along a one-dot-chain line IXC-IXC in FIG. 9A.

FIG. 9A is a schematic top plan view of the ultrasonic element 140 of this embodiment, FIG. 9B is a cross sectional view taken along a line IXB-IXB indicated by a one-dot-chain line in FIG. 9A, and FIG. 9C is a cross sectional view taken along a line IXC-IXC indicated by a one-dot-chain line in FIG. 9A. In the ultrasonic element 140 in FIGS. 9A to 9C, the same reference numerals are used to designate the same portions as the ultrasonic element 130 of FIGS. 8A and 8B.

The ultrasonic element 140 is likewise manufactured by the semiconductor substrate 10 having the SOI structure, as in the same manner to the ultrasonic element 130 shown in FIGS. 8A and 8B.

In the ultrasonic element 140, the membrane Me is formed by stripping off a portion of the buried oxide film 1b formed on the substrate 10 by the sacrificial layer etching from one side surface of the membrane Me.

In the ultrasonic element 140, etching holes H are formed around the membrane Me and beams Ha by the process of the sacrificial layer etching. The outer peripheral portions of the membrane Me are thereby partially fixed to the substrate 10 via the beams Ha, as in a similar manner to the ultrasonic element 130 shown in FIGS. 8A and 8B. Accordingly, portions of the membrane Me, which would be a bar against the deformation of the membrane Md, can be made smaller, and the membrane Me can be largely deformed as a result of distortion generated at the beams Ha, when the piezoelectric vibrator 31 is deformed with the voltage applied thereto.

As explained above and understood from the above explanation, the ultrasonic elements 120, 130 and 140 are formed such that the piezoelectric vibrators 29, 30 and 31 are resonated with the membranes M, Md and Me, respectively, at the predetermined ultrasonic wave-band frequency. The ultrasonic elements 120, 130 and 140 can output the ultrasounds having the sufficient sound pressure, so that the ultrasonic elements are usable as the emitting element. Furthermore, those ultrasonic elements can be manufactured as the ultrasonic element having the high output performance, without enlarging the size of the membranes, while keeping the manufacturing cost at a low level.

Furthermore, as in the same manner to the first and second embodiments, the ultrasonic elements of the third to fifth embodiments can be also used as the receiving elements. The receiving elements can be formed in different positions from the emitting element, but simultaneously formed with the emitting element on the same substrate, to form the ultrasonic sensing device. Accordingly, the manufacturing cost of the ultrasonic sensing device can be made lower and it becomes easier to install the ultrasonic sensing device in the automotive vehicle, when compared with the case in which the emitting element and receiving elements are separately manufactured.

What is claimed is:

1. An ultrasonic element comprising:
   a membrane formed as a thin walled portion on a substrate;
   a piezoelectric vibrator formed on the membrane to cover the same, wherein a piezoelectric thin film is sandwiched between metal electrode films, and the piezoelectric vibrator resonates with the membrane at a predetermined ultrasonic wave-band frequency; and
   a hollow-out pattern partially formed in the piezoelectric thin film to divide the piezoelectric vibrator into multiple portions, wherein the hollow-out pattern is formed in such an area corresponding to stress concentrated area which appears in vibrations of the membrane in diametrical directions thereof.

2. An ultrasonic element according to claim 1, wherein a plane shape of the membrane is formed into a polygon shape; and the stress concentrated area corresponds to a vicinity of a center of the polygon shape and a vicinity of each center of respective edges of the polygon shape.

3. An ultrasonic element according to claim 2, wherein the hollow-out pattern is formed in the piezoelectric thin turn as a circular shape in the vicinity of the center of the polygon shaped membrane.

4. An ultrasonic element according to claim 2, wherein the hollow-out pattern is formed in the piezoelectric thin film as such a polygon shape, which has the same number of edges to that of the edges of the polygon shaped membrane, in the vicinity of the center of the polygon shaped membrane.

5. An ultrasonic element according to claim 2, wherein the hollow-out pattern is formed in the piezoelectric thin film as an actiniform pattern, such that the hollow-out pattern connects the vicinity of the center of the polygon shape with the vicinity of each center of the respective edges.

6. An ultrasonic element according to claim 2, wherein the hollow-out pattern is formed in the piezoelectric thin film as an actiniform pattern, such that the hollow-out pattern connects the vicinity of the center of the polygon shape with the vicinity of each of the respective corners.

7. An ultrasonic element according to claim 2, wherein the plane shape of the membrane is formed into a square shape.

8. An ultrasonic element according to claim 1, wherein
   a plane shape of the membrane is formed into a circular shape, and
   the stress concentrated area corresponds to a vicinity of a center of the circular shape.

9. An ultrasonic element according to claim 8, wherein the hollow-out pattern is formed in the piezoelectric thin film as a circular shape in the vicinity of the center of the circular shaped membrane.

10. An ultrasonic element according to claim 1, wherein the ultrasonic element is used as an ultrasound emitting element.

11. An ultrasonic element according to claim 10, wherein an ultrasound receiving element is formed in the same substrate to that of the ultrasound emitting element, but at a different position from the ultrasound emitting element.

12. An ultrasonic element comprising:
a membrane formed as a thin walled portion on a substrate;
a piezoelectric vibrator formed on the membrane to cover the same, wherein a piezoelectric thin film is sandwiched between metal electrode films, and the piezoelectric vibrator resonates with the membrane at a predetermined ultrasonic wave-band frequency; and
a shallow groove pattern partially formed in the piezoelectric thin film not to completely separate the piezoelectric thin film into but to define multiple portions of the piezoelectric vibrator, wherein the shallow groove pattern is formed in such an area corresponding to stress concentrated area which appears m vibrations of the membrane in diametrical directions thereof.

13. An ultrasonic element according to claim 12, wherein
a plane shape of the membrane is formed into a polygon shape, and
the stress concentrated area corresponds to a vicinity of a center of the polygon shape and a vicinity of each center of respective edges of the polygon shape.

14. An ultrasonic element according to claim 13, wherein the shallow groove pattern is formed in the piezoelectric thin film as a circular shape in the vicinity of the center of the polygon shaped membrane.

15. An ultrasonic element according to claim 13, wherein the shallow groove pattern is formed in the piezoelectric thin film as such a polygon shape, which has the same number of edges to that of the edges of the polygon shaped membrane, in the vicinity of the center of the polygon shaped membrane.

16. An ultrasonic element according to claim 13, wherein the shallow groove pattern is formed in the piezoelectric thin film as an actiniform pattern, such that the shallow groove pattern connects the vicinity of the center of the polygon shape with the vicinity of each center of the respective edges.

17. An ultrasonic element according to claim 13, wherein the shallow groove pattern is formed in the piezoelectric thin film as an actiniform pattern, such that the shallow groove pattern connects the vicinity of the center of the polygon shape with the vicinity of each of the respective corners.

18. An ultrasonic element according to claim 13, wherein the plane shape of the membrane is formed into a square shape.

19. An ultrasonic element according to claim 12, wherein
a plane shape of the membrane is formed into a circular shape, and
the stress concentrated area corresponds to a vicinity of a center of the circular shape.

20. An ultrasonic element according to claim 19, wherein the shallow groove pattern is formed in the piezoelectric thin film as a circular shape in the vicinity of the center of the circular shaped membrane.

21. An ultrasonic element according to claim 12, wherein the ultrasonic element is used as an ultrasound emitting element.

22. An ultrasonic element according to claim 21, wherein an ultrasound receiving element is formed in the same substrate to that of the ultrasound emitting element, but at a different position from the ultrasound emitting element.

* * * * *